United States Patent
Nielsen et al.

(10) Patent No.: US 6,362,702 B1
(45) Date of Patent: Mar. 26, 2002

(54) CONTROLLED SELF-OSCILLATION MODULATOR AND POWER CONVERSION SYSTEM USING SUCH A MODULATOR

(75) Inventors: Karsten Nielsen, Holstebro; Thomas Frederiksen, København, both of (DK)

(73) Assignee: Bang & Olufsen PowerHouse A/S, Struer (DK)

( * ) Notice: Subject to any disclaimer, the term of this patent is extended or adjusted under 35 U.S.C. 154(b) by 0 days.

(21) Appl. No.: 09/675,647

(22) Filed: Sep. 29, 2000

(51) Int. Cl.[7] .............................. H03C 1/00; H03C 1/06; H03F 3/38; H03F 3/217; H03F 1/32
(52) U.S. Cl. .......................... 332/149; 332/162; 330/10
(58) Field of Search ...................... 332/149, 159–162; 330/10

(56) References Cited

U.S. PATENT DOCUMENTS

| | | |
|---|---|---|
| 4,531,096 A | 7/1985 | Yokoyama |
| 5,838,193 A * | 11/1998 | Myers et al. ............ 330/10 |

FOREIGN PATENT DOCUMENTS

| | | |
|---|---|---|
| WO | WO9715170 | 4/1997 |
| WO | WO9819391 | 5/1998 |
| WO | WO9844626 | 10/1998 |

* cited by examiner

*Primary Examiner*—David Mis

(57) ABSTRACT

A controlled oscillation modulator includes a comparator and a power amplification stage for pulse modulation, and a higher order oscillating loop comprising first feedback means (21) and first forward means (22) securing stable oscillating conditions. The modulator is characterized by current measurement means, arranged to measure a value ($i_L$) of a current supplied by said power amplification stage to a load (5) connected to the modulator, said measured value being supplied to said first feedback means (21), wherein said first feedback means (21) has a transfer function adapted to generate said first feedback signal based on said measured value ($i_L$), and said first forward means (21) has a transfer function adapted to generate said modulating signal based on said first feedback means and an input signal ($V_i$). Applications are general DC-DC and DC-AC power conversion with inductive loading. In a preferred embodiment the system implements a precision transconductance amplifier by a current feedback. In a futher preferred embodiment the controlled oscillation modulator implements a precision voltage power amplifier for audio amplification purposes.

9 Claims, 2 Drawing Sheets

CONTROLLED SELF-OSCILLATION MODULATOR AND POWER CONVERSION SYSTEM USING SUCH A MODULATOR

TECHNICAL FIELD

This invention relates to a self-oscillating modulator, comprising a comparator and a power amplification stage for pulse modulation, and a higher order oscillating loop comprising first feedback means and first forward means securing stable oscillating conditions, wherein said first feedback means is arranged to supply a first feedback signal to said first forward means, which is arranged to provide a modulating signal to said comparator.

The invention also relates to a switching power conversion system, such as DC-AC (e.g. audio amplification), DC-DC or AC-AC conversion systems using such a modulator. The invention may advantageously be used for improved power conversion in any system, in particular precision DC-AC conversion systems as high efficiency audio amplification.

TECHNICAL BACKGROUND

The pulse modulator is a central element of any power conversion system. Most switching power converters are based on Pulse Width Modulation (PWM) as a means to control efficient conversion between domains (DC or AC).

A typical power converter includes a PWM modulator, a switching power conversion stage, a filter and a control system. A prior art system of this type is described in U.S. Pat. No. 4,724,396 (1988) and by Mr. Attwood in Journal of the AES, November 1983. p. 842–853. However, PWM has a range of shortcomings also well known to the art, mainly due to the implementation of the carrier generation. This limits the system bandwidth and complicates design. Also, a stable and robust control system design is difficult.

In order to overcome these drawbacks, a controlled self-oscillating modulator (COM) was introduced in the applicant's international patent application PCT/DK97/00497. The disclosed modulator eliminates the need of a carrier generator, with a range of advantages, described in detail in said document.

A problem with this technique is that voluminous and expensive power components are needed, in order to compensate for filter inductor currents. Further, problems may occur when the modulator is connected to a reactive load or open load, requiring e.g. RC-Zobel compensation. The COM technology is also difficult to implement in systems with greater bandwidth. In short, it could be said that even though the COM approach overcomes some of the disadvantages of the conventional PWM technology, some limitations are still present.

OBJECTS OF THE INVENTION

Accordingly, a primary object of the invention has been to provide a superior modulation technique in switching power conversion systems that overcomes fundamental problems related to conventional techniques.

A second object has been to provide a pulse modulation in general power conversion systems that provides significant advantages in performance, topological simplification, improved robustness and stability compared to prior art.

SUMMARY OF THE INVENTION

These objects are achieved by a controlled self-oscillating modulator (COM) of the type mentioned above, characterized by current measurement means, arranged to measure a value of a current supplied by said power amplification stage to a load connected to the modulator, said measured value being supplied to said first feedback means, wherein said first feedback means has a transfer function adapted to generate said first feedback signal based on said measured value, and said first forward means has a transfer function adapted to generate said modulating signal based on said first feedback means and an input signal.

By measuring the current that is supplied to the load, the load control is much improved, eliminating the need of further load compensation. Also, any filter inductor currents are compensated, as the modulator acts as a powerful, wideband control system, leading to lower requirements on the power components.

As the current measurement itself implements a first order transfer function, and thus introduces a first pole in the oscillating loop, this leads to a simplification of the design. Especially in applications where miniaturization is important, such as mobile, personal audio equipment, this is an important advantage over prior art.

The COM according to the invention thus aims to combine the advantages of the COM technology with the advantages of current controlled PWM technology, resulting in a system presenting the following features:

The system is inherently unstable

No carrier generator is needed, saving components.

The power supply variable VS is eliminated from the effective loop transfer function.

The system acts as a wideband control system.

Clean modulation (no feedback noise and poor carrier signal).

A controllable variable switching frequency for improved efficiency and EMI.

This makes the modulator according to the invention very suitable in all types of precision DC-AC conversion applications, such as audio applications.

The modulator preferably includes means for feedback of an output voltage from said amplification stage. This enables a very compact design combining modulation and control system surrounding the central power conversion stage. Whereas combined voltage and current feedback PWM systems are well known in the art, said COM based two loop topology is an advantageous improvement and new to the art.

According to an embodiment of the voltage feedback, the first feedback means is connected to said output voltage, and the first feedback means is adapted to generate said first feedback signal based on said current value and said voltage. This can be an advantageous way to implement the double feedback, reducing the number of components.

According to another embodiment of the voltage feedback, the modulator comprises a second feedback means connected to said output voltage, and adapted to generate a second feedback signal, and a second forward means, adapted to supply said first forward block with said input signal based on said second feedback signal and a second signal. Although this implementation is somewhat more complex, it can be advantageous in some applications, where it is desirable to let the current measurement and the voltage feedback with different transfer functions.

The power amplification stage can comprise an output filter, and the second feedback means can then be connected to an output from said output filter. This permits a first filtering of the voltage before it is fed back in the feedback path.

In a preferred embodiment, the means for current measurement is adapted to implement protection functions as limitations of peak current and long term current.

The controlled oscillation modulator can advantageously be used in precision voltage or current controlled DC-AC conversion as e.g. power amplifiers for audio use.

BRIEF DESCRIPTION OF THE DRAWINGS

Preferred embodiments of the present invention will be further described in the following, with reference to the appended drawings.

DETAILED DESCRIPTION OF THE PREFERRED EMBODIMENTS

Figure 1:
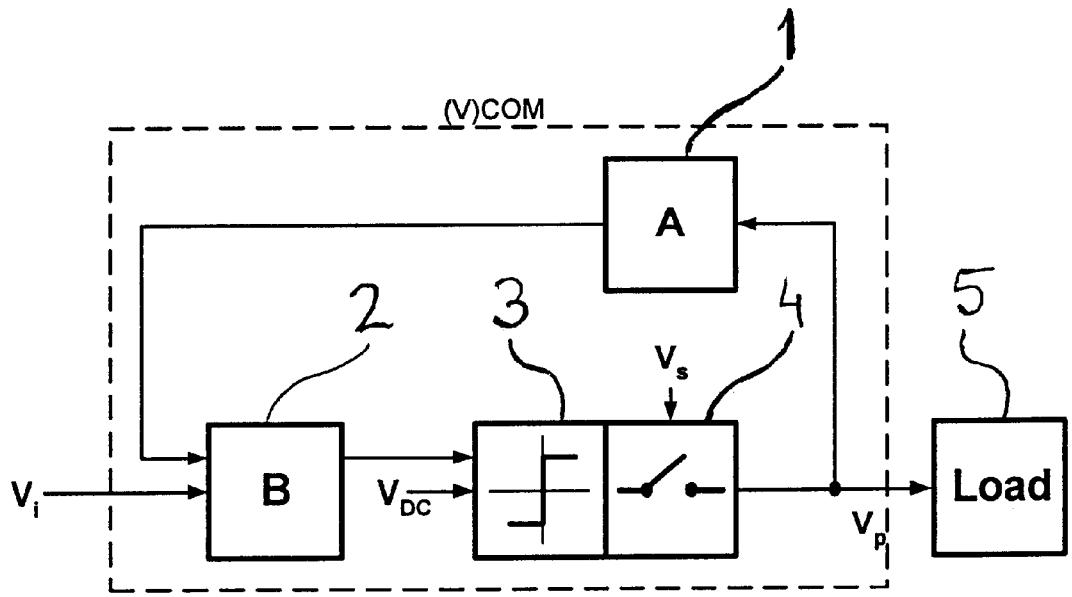
FIG. 1 shows a prior art controlled oscillating modulator based on voltage feedback.

The basic principle of the COM according to prior art is illustrated in the general block diagram of FIG. 1. As it uses voltage feedback, it will be referred to as VCOM. An input voltage $V_i$ is supplied to a forward block 2, also supplied by a feedback block 1, to derive and process error information. The compensated signal $V_b$ is supplied to a non-hysteresis comparator 3, which is referenced to a voltage $V_{DC}$, preferably a DC voltage. The resulting pulse modulated signal is power amplified in a switching power conversion stage 4 supplied by $V_s$, generation the power pulse signal $V_p$, said pulse signal driving an inductive load 5.

The block 1 processes output information from the output voltage $V_p$ and controls the overall transfer function characteristics of the system. The controlled oscillation modulator is characterized by at least two poles total in the blocks 1 and 2, in combination with the propagation delay of the modulator and power stage generating a sinusoidal like modulating signal $V_b$ to be compared with $V_{DC}$. Under these presumptions, the system realizes an oscillating system at the frequency of positive feedback. The block 1 is implemented to control the overall transfer function characteristics from $V_i$ to the output variables.

Assuming, that a constant gain K is desired over a certain bandwidth, it proves expedient with the following transfer functions:

$$A(s) = \frac{1}{K}\frac{1}{\tau_1 s+1}\frac{1}{\tau_o s+1} \quad B(s) = K_B \frac{\tau_{zB}s+1}{\tau_{pB}s+1}\frac{1}{\tau_o s+1} \tag{1}$$

In this illustrative example, the A-block 1 having a first order characteristic with a pole $s=-1/\tau_1$ placed at lower frequencies, generally more than a decade below the oscillation frequency, the oscillation conditions are comfortably determined by $\tau_0$ with the two poles placed at $s=-1/\tau_0$. The requirements for a "Controlled Oscillation Modulation (COM)" is:

$$|L(j\omega)| = |K_P A(j\omega_o)B(j\omega_o)| = 1 \wedge \angle L(j\omega_o) = 180° \tag{2}$$

where the desired system oscillation frequency is $\omega_0$. Hence, in this preferred example, the condition for controlled oscillation is:

$$|K_B K_P| = K \frac{\omega_o \tau_{pl}\tau_{pB}}{2\tau_{zB}} \tag{3}$$

The VCOM system will be forced to oscillate at $\omega_0$ due to the non-linear gain characteristic of the comparator and a switching power stage.

Figure 2:
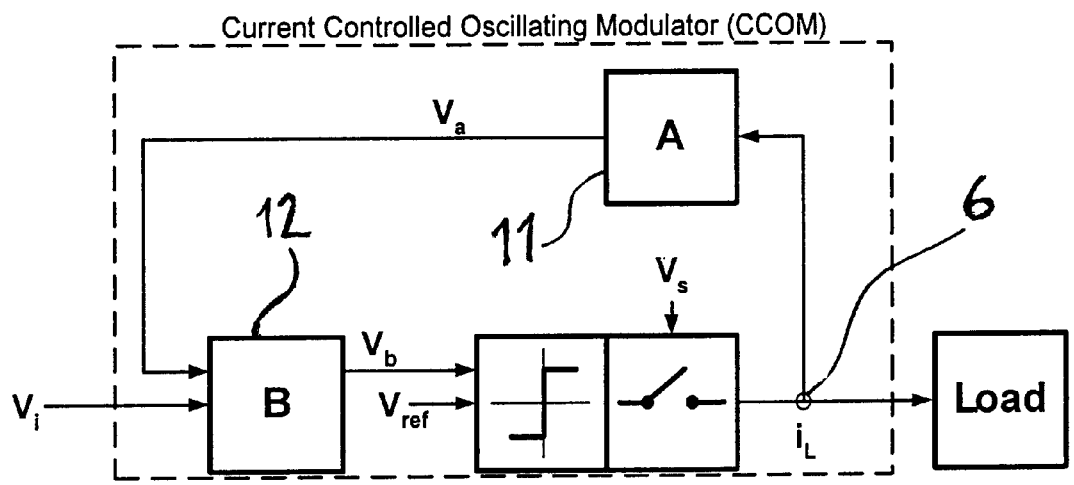
FIG. 2 shows a block diagram of a first embodiment of the invention.

As a preferred embodiment of the invention consider the system in FIG. 2. In this modulator, it is the value of the current $i_L$ delivered to the load that is used as input in the generation of a modulating signal $V_b$. The current $i_L$ is measured with a current measurement means 6, arranged after the amplification stage 4.

Advantageous transfer functions of the blocks 11 and 12 in this case are:

$$A(s) = Z_m \frac{1}{\tau_o s+1} \quad B(s) = K_B \frac{\tau_{zB}s+1}{\tau_{pB}s+1}\frac{1}{\tau_o s+1} \tag{4}$$

Assuming that the current controlled COM system, henceforth referred to as CCOM, is loaded by a second order (L,C) filter for demodulation, the loop transfer function is:

$$G_C(s) = A(s)B(s)G_O(s) \tag{5}$$

$$= K_B \frac{\tau_{zB}s+1}{\tau_{pB}s+1} \cdot \frac{K_P(\hat{v}_b)}{L} \frac{s+\frac{\omega_0}{Q_o}}{s^2+\frac{\omega_0}{Q_o}s+\omega_o^2} Z_m \frac{1}{(\tau_o s+1)^2}$$

Where:

$$\omega_0 = \frac{1}{\sqrt{LC}} \quad Q_o = R\sqrt{\frac{C}{L}} = RC\omega_0 \tag{6}$$

Hence, the condition for controlled oscillation in the CCOM system is:

$$|K_B K_P| = \frac{L}{Z_m}\frac{\omega_0 \tau_{pB}}{2\tau_{zB}} \tag{7}$$

Example parameter values for the CCOM system are:

| Parameter | Nom. Frequency (rel. to bandwidth) | Audio Case |
|---|---|---|
| $f_{zB} = \frac{1}{2\pi\tau_{zB}}$ | 2 | 40 kHz |
| $f_{pB} = \frac{1}{2\pi\tau_{pB}}$ | 0.2 | 4 kHz |
| $f_o$ | 20 | 400 kHz |

Those skilled in the art will appreciate that many well known ways could be used to implement the CCOM system with alternative parameters and alternative placement of the poles. Thus, the example is only illustrative and demonstrating a simple broad band transconductance amplifier system with a constant in-band transconductance of $1/Z_m$.

Figure 3:
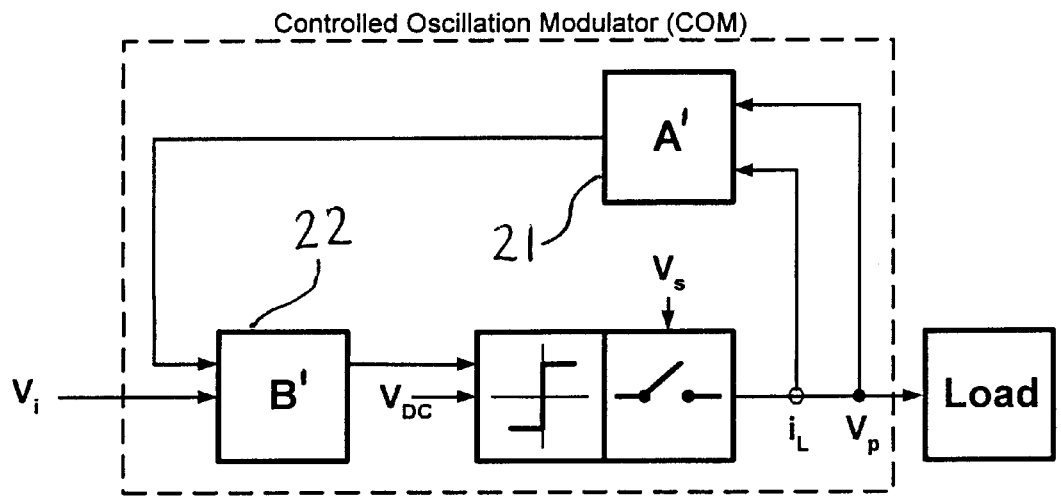
FIG. 3 shows a block diagram of a second embodiment of the invention.
Figure 4:
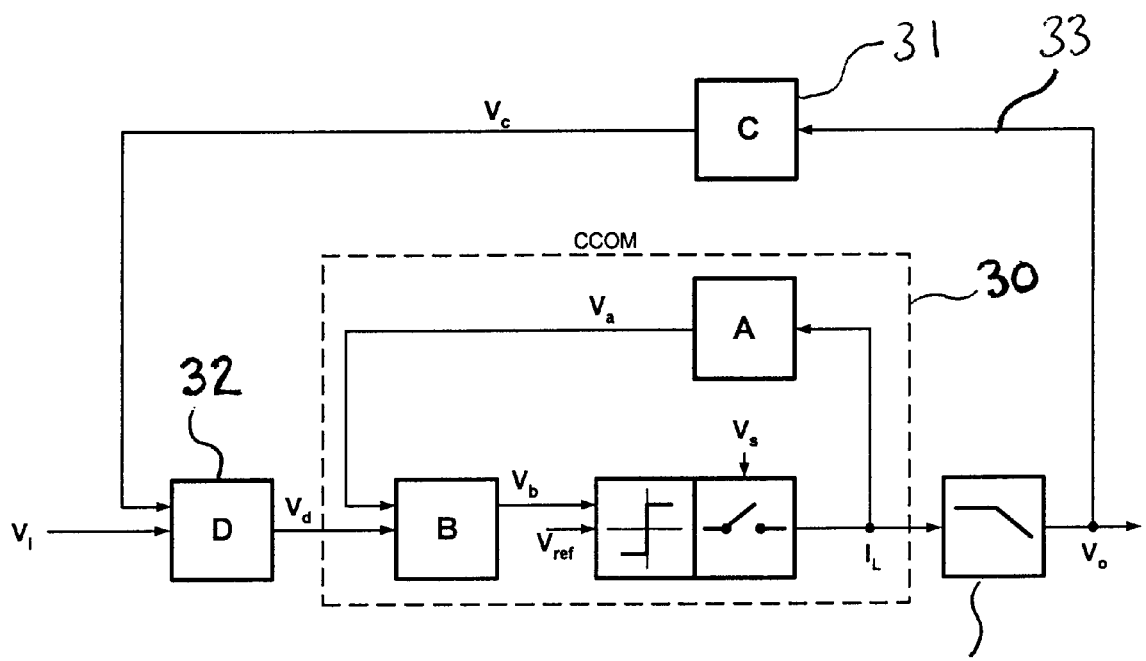
FIG. 4 shows a block diagram of a third embodiment of the invention.

The CCOM modulator illustrated in FIG. 2 can advantageously be combined with the VCOM according to prior art, and two preferred embodiments of this combination are illustrated in FIG. 3 and 4.

This combined modulator may advantageously be implemented in a general purpose high performance DC-AC conversion system, with a 2:nd order demodulation filter and a global voltage loop.

In FIG. 3, the transfer function A' of feedback block 21 is adapted to receive a voltage feedback from the amplification stage 4 as well as the measured current value $i_L$. Suitable adjustment of the transfer function B' of forward block 22 is also made.

Another example is the broadband, constant gain power amplifier of FIG. 4, where two additional blocks 31 and 32 have been introduced. The amplifier thus comprises a CCOM 30 according to FIG. 2, surrounded by a voltage feedback path 33. The voltage signal $V_o$ is taken after an output filter 34, and is connected to the block 31. The generated signal $V_c$ is then supplied to the block 32, also supplied with the input voltage $V_i$. It is the output from block 32 which is supplied to the forward block 11 of the CCOM 30, together with the signal $V_a$ from the feedback block 12. Preferred transfer functions of the blocks 31 and 32 are:

$$C(s) = \frac{1}{K} \frac{1}{\tau_{pC}s + 1} \qquad D(s) = K_D \frac{\tau_{zD}s + 1}{\tau_{pD}s + 1} \qquad (8)$$

By adjusting $K_D$ the desired voltage loop bandwidth, $f_v$, is easily implemented. Example parameters are:

| Parameter | Nom. Frequency (rel. to bandwidth) | Audio Case |
|---|---|---|
| $f_{zD} = \frac{1}{2\pi\tau_{zD}}$ | 2 | 40 kHz |
| $f_{pD} = \frac{1}{2\pi\tau_{DB}}$ | 0.2 | 4 kHz |
| $f_v$ | 5 | 100 kHz |

Those skilled in the art will appreciate that many well-known ways could be used to implement the transfer functions in the blocks of the COM system. The system gain K is maintained constant within the bandwidth of the system.

An alternative advantageous embodiment of the invention is a two-pole compensation of the COM system, such that the in band loop gain is steeper (although less than −12 db/octave) for improved feedback compensation by the combined COM modulator and feedback control system. Those skilled in the art will understand that this can e.g. be implemented in the B-block.

Other embodiments of the invention include input filtering and limitation section to control the transfer function and to provide improved clipping characteristics, which may advantageously be of the soft clipping type. In addition the limiter will keep the oscillator running and the control loop in operation. A third advantage of a properly implemented limiter function is that there will not be and lag during recovery from overload. Those skilled in the art will appreciate that many well-known ways to implement such a limiting function.

What is claimed is:

1. Controlled self-oscillating modulator, comprising a comparator and a power amplification stage for pulse modulation, and a higher order oscillating loop comprising first feedback means and first forward means securing stable oscillating conditions, wherein said first feedback means is arranged to supply a first feedback signal to said first forward means, which is arranged to provide a modulating signal to said comparator, characterized by current measurement means, arranged to measure a value of a current supplied by said power amplification stage to a load connected to the modulator, said measured value being supplied to said first feedback means, wherein said first feedback means has a transfer function adapted to generate said first feedback signal based on said measured value, and said first forward means has a transfer function adapted to generate said modulating signal based on said first feedback signal and an input signal.

2. Controlled self-oscillating modulator according to claim 1, further including means for feedback of an output voltage from said amplification stage.

3. Controlled self-oscillating modulator according to claim 2, wherein said first feedback means is connected to said output voltage, said first feedback means being adapted to generate said first feedback signal based on said current value and said voltage.

4. Controlled self-oscillating modulator according to claim 2, further comprising second feedback means connected to said output voltage, adapted to generate a second feedback signal, and second forward means, adapted to supply said first forward block with said input signal based on said second feedback signal and a second signal.

5. Controlled self-oscillating modulator according to claim 4, wherein said power amplification stage comprises an output filter, and wherein said second feedback means is connected to an output from said output filter.

6. Controlled self-oscillating modulator according to claim 1, further comprising limiter means to control the modulation depth.

7. Controlled self-oscillating modulator according to claim 6, wherein said means for current measurement is adapted to implement protection functions as limitations of peak current and long term current.

8. Power conversion system, implementing a modulator according to claim 1.

9. Power conversion system according to claim 8, used to drive an electrodynamic transducer load directly.

* * * * *